United States Patent
Ghazali et al.

(10) Patent No.: US 7,298,218 B2
(45) Date of Patent: Nov. 20, 2007

(54) FREQUENCY SYNTHESIZER ARCHITECTURE

(75) Inventors: Mostafa Ghazali, Grenoble (FR); Jouffre Pierre-Olivier, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 62 days.

(21) Appl. No.: 11/196,492

(22) Filed: Aug. 3, 2005

(65) Prior Publication Data
US 2006/0030285 A1   Feb. 9, 2006

(30) Foreign Application Priority Data
Aug. 6, 2004   (FR) .................................. 04 08737

(51) Int. Cl.
*H03L 7/00* (2006.01)
(52) U.S. Cl. .................... 331/16; 327/156; 455/260
(58) Field of Classification Search ............... 331/16; 455/260; 327/156
See application file for complete search history.

(56) References Cited

U.S. PATENT DOCUMENTS

| | | | |
|---|---|---|---|
| 5,448,191 A * | 9/1995 | Meyer ..................... 327/105 |
| 5,731,743 A | 3/1998 | Sauer |
| 6,157,694 A | 12/2000 | Larsson |
| 6,542,013 B1 | 4/2003 | Volk et al. |
| 6,583,674 B2 * | 6/2003 | Melava et al. .............. 331/16 |
| 6,642,800 B2 * | 11/2003 | Drapkin et al. ............. 331/16 |
| 6,724,265 B2 * | 4/2004 | Humphreys ................ 331/17 |
| 2002/0121938 A1 | 9/2002 | Fan |
| 2003/0058009 A1 | 3/2003 | Fallahi et al. |

FOREIGN PATENT DOCUMENTS

| | | |
|---|---|---|
| DE | 102 57 185 B3 * | 5/2004 |
| EP | 1 298 804 | 4/2003 |
| WO | WO 03/029002 A2 | 5/2003 |
| WO | WO 03/029002 A3 | 5/2003 |

OTHER PUBLICATIONS

Preliminary French Search Report, FR 0408737, dated Nov. 17, 2004.

* cited by examiner

*Primary Examiner*—Benny Lee
*Assistant Examiner*—Levi Gannon
(74) *Attorney, Agent, or Firm*—Gardere Wynne Sewell LLP

(57) ABSTRACT

A frequency synthesizer is provided with a PLL, including a divider by N circuit and a phase generation circuit which is connected to the output of the VCO of the PLL. The phase generation circuit generates a predetermined number of phases synchronized on the frequency of the VCO and at intervals from each other equal to a time difference representative of a phase error measured by a phase comparator of the PLL. A signal generation circuit provides an intermediate signal starting from the phases, the period of which is dependent on the time difference and a first adjustment parameter. The intermediate signal is applied to the divider by N circuit. A correction circuit determines the phase error accumulated during N−1 periods of the intermediate signal and makes a correction of the intermediate signal every N periods of the intermediate signal as a function of the accumulated phase error such that the loop becomes stable.

31 Claims, 5 Drawing Sheets

FREQUENCY SYNTHESIZER ARCHITECTURE

PRIORITY CLAIM

The present application claims priority from French Application for Patent No. 04 08737 filed Aug. 6, 2004, the disclosure of which is hereby incorporated by reference.

BACKGROUND OF THE INVENTION

1. Technical Field of the Invention

The present invention generally relates to domain of phase locked loops, and particularly phase locked loops made in the form of an integrated circuit and that are typically used in high frequency synthesis. More precisely, it concerns a frequency synthesizer enabling precise adjustment of the frequency, with a high signal-to-noise ratio and with advanced integration capabilities.

2. Description of Related Art

A Phase Locked Loop (PLL) is generally widely used for frequency synthesis. This type of system is capable of multiplying a reference frequency by an integer number and thus addressing an entire frequency range with a given frequency step. More precisely, a phase locked loop is a slaving system generating a frequency equal to the K times the reference frequency that it receives in input. Thus, the output frequency given by a voltage controlled oscillator is divided and then compared with a frequency that may be produced by a quartz. A charge pump formed from two current sources then reacts by injecting or withdrawing current in an integrating filter that controls the output oscillator.

However, in order to obtain a finer output frequency from the frequency synthesizer and therefore a lower frequency resolution, it is necessary to use "fractional" phase locked loops in order to make a division with a decimal part. Such frequency synthesizers can thus be used to generate frequencies that can be adjusted by integer or non-integer multiples of a reference frequency.

Such devices like those described above are known. FIG. 1 represents a conventional frequency synthesizer that can be adjusted by integer values, and FIG. 2 represents a frequency synthesizer that can be adjusted by fractional values.

Therefore, FIG. 1 illustrates the structure of a frequency synthesizer designed for high-frequency synthesis based on a programmable standard phase locked loop 10. The phase locked loop 10 essentially comprises a voltage controlled oscillator (VCO) 12, a frequency divider 14, a phase—frequency comparator (PFD) 16, a charge pump (CP) circuit 18 and a low-pass integrating filter (LPF) 20. The voltage controlled oscillator 12 outputs an output signal Fvco with a frequency of the order of one Giga hertz and that can be increased or reduced as a function of a control voltage applied to its input. This control voltage is generated by the phase—frequency comparator 16 and the charge pump circuit 18 connected to the input of the oscillator 12 through the loop filter 18. The phase—frequency comparator compares the frequency Fpfd (and/or the phase) of a signal output by the frequency divider 14 and the frequency of a reference signal Fref, for example produced by a quartz device. For feasibility of the system, given the high frequency synthesis context, a pre-divider circuit 26 may be integrated into the loop 10 between the oscillator 12 and the frequency divider 14. This circuit 26 is used to introduce a frequency division factor S applied to the frequency signal Fvco before being input to the frequency divider 14.

A frequency divider 22 may be inserted between the quartz device and the phase—frequency comparator 16, such that the phase—frequency comparator compares the signal Fpfd with a frequency signal Fin equal to a division by a predetermined factor R of the frequency of the signal Fref. An adjustment input 22a fixes the value R. Thus, the phase comparator can be made to operate at a much lower frequency than the quartz.

When the frequency of the signal produced by the frequency divider 14 is less than the frequency of the reference signal Fin, the phase—frequency comparator 16 controls the charge pump circuit 18 which, associated with the loop filter 20, outputs a voltage controlling the increase in the frequency of the oscillator 12. Conversely, the frequency of the oscillator 12 is reduced when the frequency of the signal output by the frequency divider 14 is greater than the frequency of the signal Fin.

The frequency divider 14 is a device that divides the frequency of the signal from the oscillator 12 only by integer values. Therefore the division ratio that can be adjusted by integer values, is an integer number denoted N. An adjustment input 14a fixes this division ratio.

Also, a frequency divider 24 may be inserted at the output from the oscillator 12, so as to obtain an output signal from the frequency synthesizer for which the frequency Fout is equal to a division by a predetermined factor P of the frequency of the signal Fvco output from the oscillator. An adjustment input 24a fixes the value P.

Therefore the synthesizer output frequency, denoted Fout, is such that:

$$Fout = \frac{S \times N}{P} \times Fin$$

and the frequency step at the output from the oscillator 12 is such that:

$$\Delta Fvco = S \times Fin$$

where $Fin = F_{ref}/R$.

Therefore the oscillation frequency of the voltage controlled oscillator may be adjusted by frequency steps with a value equal to Fin, ignoring the factor S. The step then corresponds to a variation of the division ratio from N to N+1, or from N to N−1. To obtain a low frequency step and therefore a relatively precise adjustment of the loop frequency, the value of the frequency of the reference signal should be preferably chosen low, of the order of a few tens of kilo Hertz, for example. This means that a very large loop filter is required to keep the PLL stable. But such a filter makes it impossible to use integratable solutions. Note also that a low reference frequency makes it necessary to select high values N of the division ratio, which causes noise in the loop and degrades expected performances.

A much finer adjustment of the frequency of the output signal produced by the voltage controlled oscillator may be obtained without the above mentioned disadvantage with the constraint of the choice of a relatively low value for the reference frequency, with a frequency synthesizer conforming with FIG. 2.

The synthesizer in FIG. 2 comprises a phase locked loop 10 in which the elements in common with the elements in loop 10 in FIG. 1 have the same reference.

On the other hand, the frequency divider 14 not only has an adjustment input 14a to fix the value of the division ratio N, but it also has a switching input 14b to switch the division ratio about the value N between two or more consecutive values, for example between two values equal to N and N+1. The switching input 14b is connected to a sigma-delta modulator 30 in the form of a order 1, 2 or 3 digital modulator that modifies the division ratio at the divider 14. The sigma-delta modulator 30 has a first digital input 30a on which an adjustment set value denoted K coded on u bits is applied. It comprises a second input 30b connected to the output from the divider 14, for which the output signal is used to clock the modulator.

The frequency divider 14 is designed to make a frequency division with a first division ratio when its switching input 14b receives a first logical state output by the sigma-delta modulator and so as to make a division with a second division ratio when the input 14b receives a second logical switching state of the sigma-delta modulator. For example, the division ratio is N for the first logical state and N+1 for the second logical state. Although the division ratio of the frequency divider 14 is an integer number at all times, repeated switching of the ratio between N and N+1 can result in an average resulting division ratio α between these two values, in other words a non-integer number.

More precisely, considering that the adjustment set value K applied to the first input 13a of the sigma-delta modulator is coded on u bits, a fractional part of the division ratio of the divider 14 made by the modulator can be defined equal to $$\frac{K}{2^u}.$$

Thus, the division ratio α including the integer part N and the fractional part produced by the modulator, can be written:

$$\alpha = N + \frac{K}{2^u}.$$

Therefore the output frequency from the synthesizer is such that:

$$Fout = \frac{\alpha \times S}{P} \times Fin$$

and the output frequency step from the voltage controlled oscillator is:

$$\Delta Fvco = \frac{S \times Fin}{2^u}.$$

Thus, the frequency of the phase locked loop can be continuously adjusted between two values fixed by the choice of the division ratio N applied to the adjustment input 14a of the frequency divider 14 and by the choice of the adjustment set value K applied to the sigma-delta modulator. The result of the above formula is that the adjustment step can be as fine as $Fin/2^u$, within a factor S. For coding the adjustment set value K of the sigma-delta modulator on 8 or 16 bits, in other words for example for u=8 or u=16, the adjustment may be almost continuous and therefore practically independently of the reference frequency. Therefore, due to the algorithm used by the sigma-delta modulator, this solution can give good resolution without needing to drop to a low reference frequency, as for the first solution.

However, the sigma-delta modulator generates a high noise power in the loop that can cause undesirable fluctuations of the phase of the signal output by the voltage controlled oscillator. This behavior will degrade the signal-to-noise ratio of the system, although a high signal-to-noise ratio is absolutely necessary to guarantee good system performances, particularly for wide band applications.

Noise introduced by the sigma-delta modulator algorithm can be compensated by making the cutoff low at the loop filter, so as to reject a maximum amount of noise from the useful frequency band. However, if the cutoff frequency of the loop filter is reduced for this purpose, the phase noise from the voltage controlled oscillator becomes too important with regard to the expected performances of the system, particularly in the context of wide band applications in which such synthesizers are used. Therefore the architecture presented with reference to FIG. 2 makes it very difficult to obtain an acceptable compromise between noise from the sigma-delta modulator algorithm and phase noise from the voltage controlled oscillator.

A need accordingly exists for a new frequency synthesizer architecture without the limitations mentioned above related to the frequency synthesizer architectures according to prior art.

SUMMARY OF THE INVENTION

Embodiments of the present invention propose a frequency synthesizer of the fractional divider type, in other words with a digital algorithm in the loop capable of achieving a very good precision of the generated frequency including a precise adjustment of it, while presenting a particularly low phase noise, thus guaranteeing good signal-to-noise performances of the system. Advantageously, such synthesizers can be completely integrated.

According to an embodiment of the invention, a frequency synthesizer includes a phase locked loop comprising a phase comparator for which a first input is connected to a reference signal source, a voltage controlled oscillator associated with modulation means with a global modulation ratio which when multiplied by the reference signal frequency produces the required output frequency, the modulation means comprising a frequency divider circuit to divide the frequency of the oscillator output signal by a variable integer division factor N, and the output of which is connected to the other input of the phase comparator. The synthesizer also comprises phase generation means connected between the oscillator and the modulation means, to generate a predetermined number of phases synchronized on the frequency of the said oscillator and at intervals from each other equal to a time difference representative of the phase error measured by the phase comparator. The modulation means comprises generation means capable of generating an intermediate signal from the phases, the period of which is dependent on the time difference between the phases and a first adjustment parameter MD supplied to the generation means by the control means of the generation means. The intermediate signal is applied to the divider by N circuit. Correction means determines the phase error accumulated during N−1 periods of the intermediate signal and makes a correction of the intermediate signal every N periods of the intermediate signal as a function of the accumulated phase error, such that the loop becomes stable.

Advantageously, the output from the intermediate signal generation means is looped back to control means of the generation means, such that the control means are clocked at the frequency of the generated intermediate signal.

Preferably, the intermediate signal generation means comprise a multiplexer circuit.

According to one embodiment, the control means of the intermediate signal generation means comprise an adder circuit for which a first input receives the first adjustment parameter and the second input is connected to the correction means, the output from the adder circuit being connected to a decoder circuit to control the generation means based on information output by the adder circuit.

Advantageously, the output from the correction means is connected to the second input to the adder circuit of the control means through selection means, the selection means being clocked by the output signal from the divider by N circuit, such that the output from the correction means are selected and supplied to the adder circuit once every N periods of the intermediate signal during one period of the intermediate signal.

According to one embodiment, the correction means comprise a sigma-delta modulator clocked by the output signal from the divider by N circuit, the modulator comprising an input to contain a second adjustment parameter PE coded on n bits and defining a variable fractional part of the modulation ratio, the output from the sigma-delta modulator being connected to a first input of an adder circuit receiving a third adjustment parameter MDC on a second input, the output from the adder circuit being connected to the selection means.

Preferably, the sigma-delta modulator is an order 2 modulator, and the first and third adjustment parameters MD and MDC respectively are determined such that:

$$MD + MDC \leq nt - 2,$$

where nt is the number of phases generated by the phase generation means.

The global modulation ratio is such that:

$$\beta = \frac{NxMD + MDC + \frac{PE}{2^n}}{nt}$$

where nt is the number of phases generated by the phase generation means.

Preferably, a frequency divider circuit introducing a division factor D is inserted between the output from the modulation means and the other input of the phase comparator.

According to one variant, the sigma-delta modulator is inhibited or deleted.

According to this variant, the first and third adjustment parameters MD and MDC respectively are determined such that:

$$MD + MDC \leq nt$$

where nt is the number of phases generated by the phase generation means.

The global modulation ratio is then such that:

$$\beta = \frac{NxMD + MDC}{nt}$$

where nt is the number of phases generated by the phase generation means.

Preferably, the phase generation means comprise a frequency divider circuit introducing a predetermined division factor into the loop.

Preferably, a frequency divider circuit is connected to the first input of the phase comparator, so as to lower the frequency of the reference signal by a predetermined factor.

Preferably, a frequency divider circuit is connected to the output of the oscillator such that the required output frequency from the synthesizer is determined by dividing the oscillator output frequency by a predetermined factor.

Preferably, the frequency synthesizer is made in the form of an integrated circuit.

In accordance with another embodiment of the invention, a feedback circuit for a phase lock loop (PLL) is presented. The PLL includes a voltage controlled oscillator generating an output frequency signal and a comparator which receives an input frequency signal and a feedback frequency signal. The feedback circuit comprises a modulation circuit that receives the output frequency signal and generates the feedback frequency signal. That modulation circuit includes a multiplexer receiving a plurality of phases of the output frequency signal, a control circuit operable to select one of the plurality of phases of the output frequency signal as an intermediate signal, and an integer divider circuit that divides the intermediate signal to generate the feedback frequency signal.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
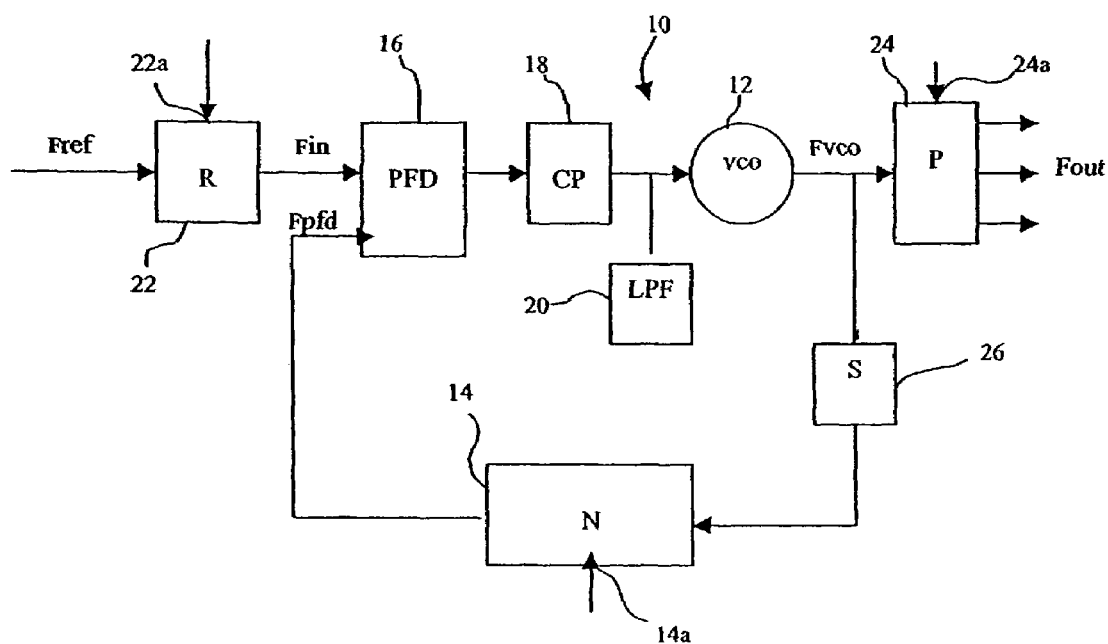
FIG. 1, already described, is a diagram showing a frequency synthesizer based on a programmable standard phase locked loop.
Figure 2:
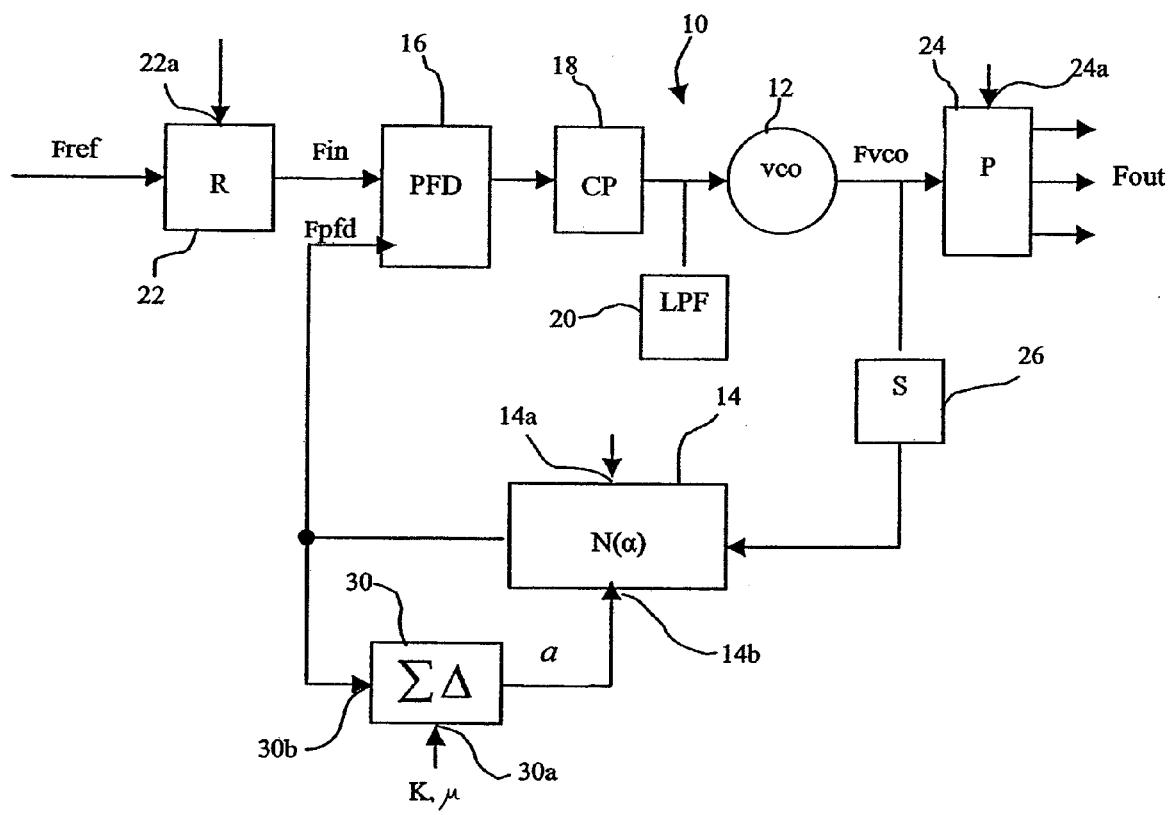
FIG. 2, already described, is a diagram showing a frequency synthesizer based on a fractional type phase locked loop.
Figure 3:
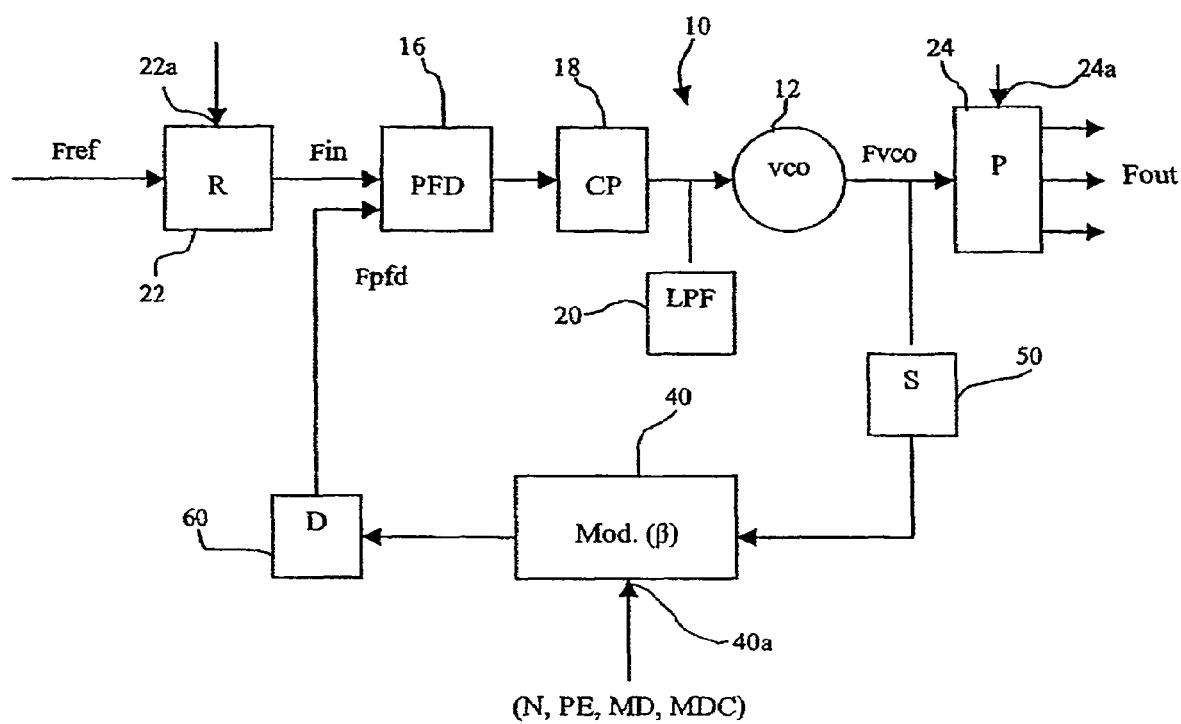
FIG. 3 shows a diagram showing a frequency synthesizer according to the invention.

Therefore, FIG. 3 illustrates the diagram of a frequency synthesizer conform with this invention based on an improved fractional PLL by division. Elements in common with frequency synthesizers according to prior art already described are marked with the same references.

Thus, according to the invention, the phase locked loop now integrates particular modulation means 40 with a global modulation ratio β which, when multiplied by the frequency of the reference signal Fin applied to the first input of the phase comparator 16, produces the output frequency Fvco required at the output from the oscillator 12. As already seen with reference to the previous architectures, a frequency divider 22 may be inserted between a quartz device outputting a reference signal Fref and the phase comparator 16, such that the phase comparator compares the signal Fpfd with a frequency reference signal Fin determined by dividing the frequency of the signal Fref by a predetermined factor R. Thus, the phase comparator can be made to operate at a lower frequency than the quartz.

Also, a frequency divider 24 may be inserted at the output from the oscillator 12 so as to obtain an output signal from the frequency synthesizer for which the frequency Fout is equal to the frequency of the oscillator output signal Fvco divided by a predetermined factor P.

A pre-divider circuit 50 may also be integrated in the loop between the oscillator 12 and the modulation block 40. This circuit 50 introduces a division factor S at the signal frequency Fvco before being input to the modulation block 40.

Finally, a frequency divider circuit 60 may also be inserted between the output from the modulation means 40 and the input to the phase comparator 16 to which the output from the modulation means is connected. This divider circuit then introduces a division factor D to the frequency of the output signal from the modulation means, preferably equal to two, and improves the performance of the system.

Thus in this configuration, the output frequency Fout from the frequency synthesizer is written:

$$Fout = \frac{D \times \beta \times S}{R \times P} \times Fref$$

The global modulation ratio $\beta$ is defined by a set of adjustment parameters, MD, MDC, PE and N respectively that will be described more precisely below and that are input to the modulation block 40, so that this modulation block 40 can be programmed according to the performances required by the user.

Typically, operation of a frequency synthesizer cyclically includes a sequence of a measurement phase and a correction phase. The measurement phase according to prior art comprises at least one first frequency division of the output signal from the oscillator so as to obtain an intermediate signal, and then a first measurement signal is determined at the phase comparator representing the difference in time between this first intermediate signal and the reference signal, in other words the phase error between these two signals. The correction then consists of correcting the oscillator control in accordance with the error signal.

However, determination of the phase error to be corrected is based on an integer period of the oscillator output signal. The invention proposes a very different operating method. Thus, phase generation means 50 are placed between the output from the oscillator 12 and the modulation block 40.

Figure 4:
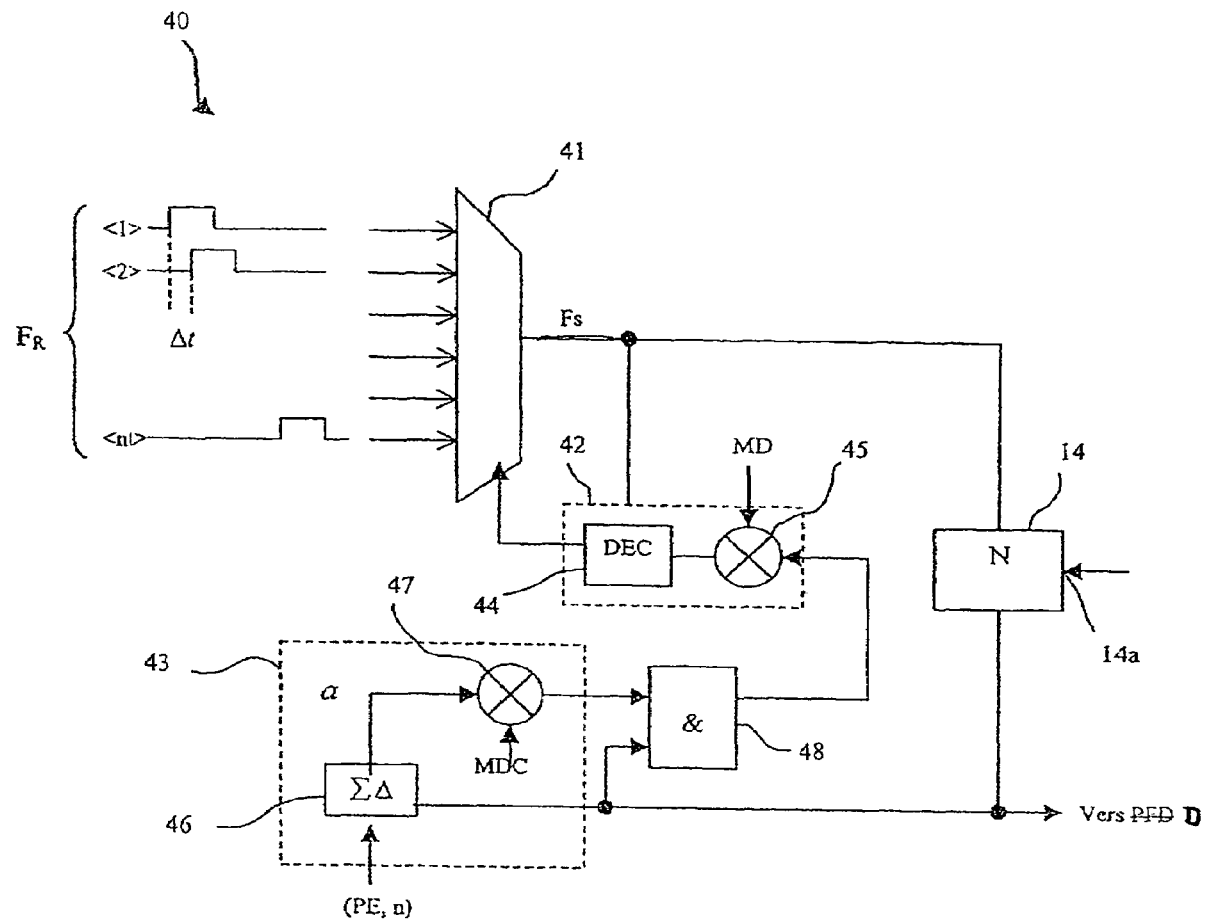
FIG. 4 shows a detailed diagram of the modulator used in the device in FIG. 3.

As can be seen in FIG. 4, a number nt of phases is generated. Typically, the frequency division process used by the circuit 50 will be used to generate these phases starting from the oscillator output signal, using known techniques that will not be described further in the context of this description. However, phases may be generated using other methods, without the need to introduce a predetermined division factor S. For example, the VCO 12 could generate nt/2 phases, and then an analog or digital interpolator could be used to double this number of phases to reach the required nt phases, without necessarily introducing a division factor (S).

More precisely, nt phases offset from each other are obtained in a known time $\Delta t$ representative of the phase error measured by the phase comparator. Thus, this delay between the phases corresponds to the delay to be recovered at the time of the phase comparison at the block 16. The number nt of phases obtained is related to the division made between the oscillator and the modulation block 40. These phases, all at constant frequency FR are fully synchronized with the oscillator frequency. Thus, the precision of the oscillator that operates at high frequency is maintained, for example in the 2 to 5 Giga hertz frequency band.

Thus, the phase error to be corrected corresponds to the time difference $\Delta t$ between the phases, and the measurement cycles are then based on the plurality of generated phases offset from each other by $\Delta t$.

Therefore, FIG. 4 shows a detailed diagram of the modulation means 40 used in the device in FIG. 3. Therefore the modulation means 40 receive the plurality of generated phases in input. The modulation means 40 comprise a multiplexer 41 receiving the nt frequencies on a corresponding number of multiplexer inputs. The multiplexer reconstitutes an intermediate signal from the nt phases at a stable frequency Fs higher than or equal to the frequency of the phases. Control means 42 of the multiplexer are provided for this purpose. More precisely, the control means 42 comprise an adder 45 receiving a first adjustment parameter MD and a decoder circuit 44 on a first input, to control the multiplexer based on information supplied to it by the adder 45. The output from the multiplexer is looped back at its control means.

Thus, the output frequency generated by the multiplexer is used to clock the adder 45 that controls the decoder circuit 44 for selecting one of the nt multiplexer inputs, at each pulse. Therefore the system starts by looping with the adjustment parameter MD to generate the intermediate signal at the frequency Fs that is related to the time difference $\Delta t$ between the phases and the adjustment parameter MD. The intermediate signal Fs is applied in stage 40 to a frequency divider circuit 14 that divides the frequency of the intermediate signal Fs by an integer division factor N, and the output of which is sent to the phase comparator circuit, possibly through the divider by D circuit 60.

The intermediate signal Fs divided by N is also used to clock a sigma-delta modulator 46, this modulator includes an input to which a second adjustment parameter PE coded on n bits is applied, and defining an adjustable fractional part of the global modulation ratio equal to PE/$2^n$. Therefore, this block makes the fractional part and the digital algorithm used may be of order 1, 2 or 3 for this type of PLL.

Note that the integer part N is also programmable. However, it cannot be programmed on the fly under the control of the sigma-delta modulator algorithm, which is the case for fractional PLL architectures by division according to prior art.

The output from the sigma-delta modulator is connected to a first input of an adder circuit 47, to which a third adjustment parameter MDC is applied onto a second input, the output from the said adder circuit 47 being connected to a second input in the adder circuit 45 of the multiplexer control means 42 through selection means 48. The assembly formed by the sigma-delta modulator 46 and the adder circuit 47 receiving the MDC parameter on a first input actually forms a correction block 43 at the loop, the role of which consists more particularly of determining the phase error accumulated during the N−1 periods of the intermediate signal for the frequency to be obtained at the synthesizer output and to correct the intermediate signal to take account of this error.

According to the invention, this correction is made once every N pulses of the signal Fs. Thus, the selection means 48 are clocked by the output signal from the divider by N circuit, such that the output from the correction means 43 formed by the output from the adder circuit 47 are selected by the selection circuit 48 and supplied to the adder circuit 45 of the control means of the multiplexer once every N periods of the signal Fs. In this way, the MDC+a parameters (where a represents the variation introduced by the sigma-delta modulator 46 once every N pulses of the signal Fs, "a" depending on the type and order of the modulator, namely for example a=2, 1, 0 or −1 for a multibit second order sigma-delta modulator) are selected for an integer period Ts corresponding to a long duration of the divided signal due to selection means 48, and are added to the first adjustment parameter MD once every N periods of the signal Fs.

Figure 5:
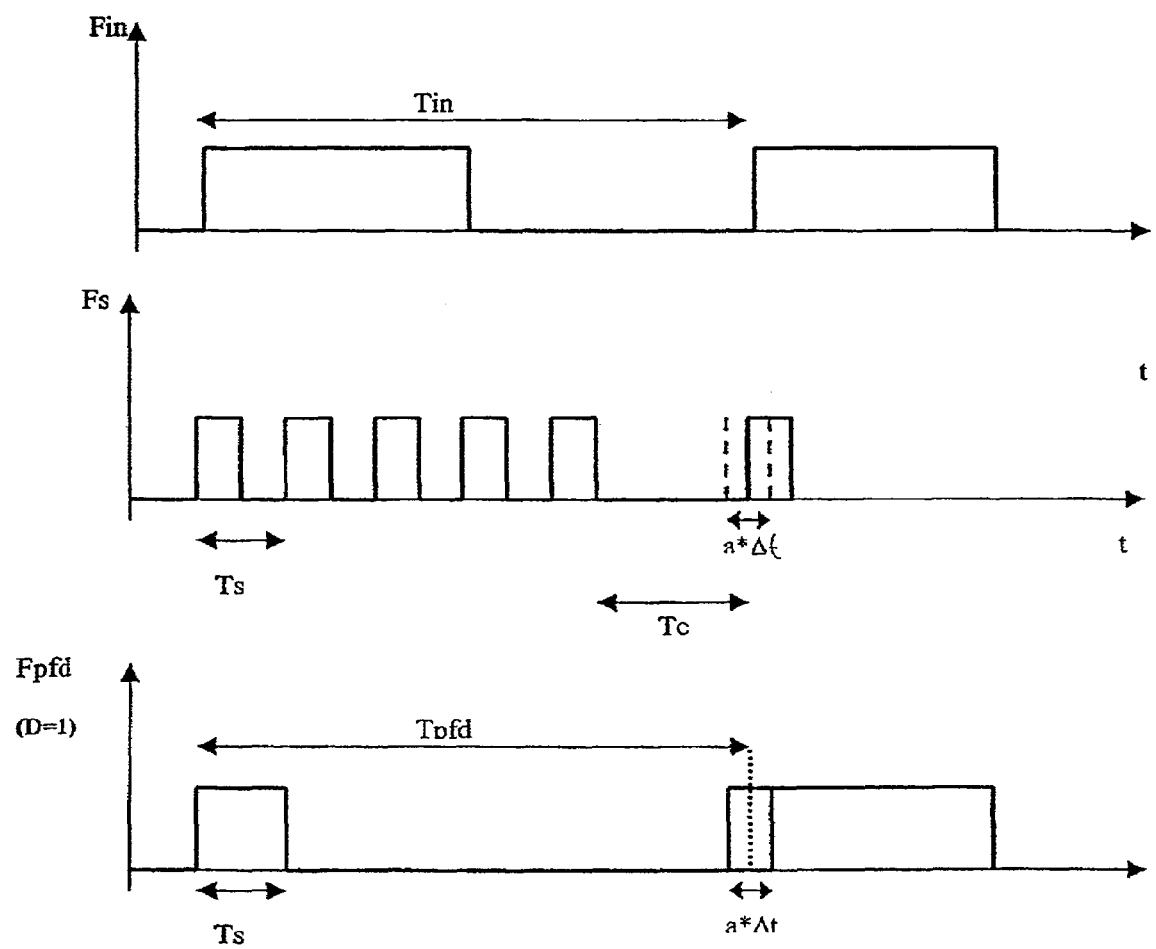
FIG. 5 illustrates operation of modulation means used starting from time diagrams of the Fs and Fin signals.

As illustrated in FIG. 5 for D=1, which shows a time diagram of a created signal Fs and a reference signal Fin, and starting from a theoretical frequency corresponding to the signal frequency Fs, calculations show that a variation of a*Δt is made around the period of the signal Fin to be locked onto, the average value of this variation being equal to $PE/2^n$. Thus, according to the principle of the invention, this accumulated phase error Tc-Ts is recovered during the N−1 pulses of the signal Fs, and is then added to the Nth pulse of the signal Fs with period Ts. This is possible due to the correction block 43 that uses the sigma-delta modulator associated with the adjustment parameter MDC.

Therefore, there are D×N signal fronts Fs during the period Tin. Thus:

$$Tin = Dx((N-1) \times Ts + Tc), \text{ and}$$

$$Tc = (MD + MDC + PE/2^n)\Delta t$$

$$Ts = MD \times \Delta t$$

Therefore Tin=Dx(N×Ts+(MDC+PE/$2^n$) Δt), the second part of this equation corresponding to the additional skip necessary to reach Tin, generated using the algorithm of the sigma-delta modulator associated to the MDC adjustment parameter.

According to this characteristic of the invention, it is required to make the sigma-delta modulator algorithm react only once every N periods of Fs, which can advantageously result in a signal Fpfd being applied to the input to the PFD circuit 16, presenting only a small phase error a*Δt to be corrected and thus to reduce the noise power produced in the loop by the sigma-delta modulator. By thus reducing the noise power introduced by the sigma-delta modulator, there is no longer a need for such low frequency filtering in the loop filter, unlike architectures in prior art that generate a phase error equal to a*S*Tvco to the input of the PFD. This noise reduction appears to be a very acceptable compromise between the oscillator noise and the noise generated by the sigma-delta modulator. With the proposed configuration, a higher cutoff frequency for the loop filter provides a means of efficiently filtering the parasite rays inherent to conventional fractional phase locked loops, but it also makes it possible to significantly reject the phase noise generated by the oscillator. Consequently, signal-to-noise ratio performances are increased.

With the embodiment shown in FIG. 4, the main characteristics described below are obtained:

The global modulation ratio including the integer part plus the fractional part is as follows:

$$\beta = \frac{NxMD + MDC + \frac{PE}{2^n}}{nt}$$

The minimum frequency step at the output from the oscillator is:

$$\Delta_{Fvco} = \frac{DxSxFref}{Rxntx2^n}$$

Since correct operation of the frequency synthesizer in FIG. 4 with the characteristics as defined above depends on the following inequality being respected for an order 2 modulator:

$$MD + MDC \geq nt - 2$$

Using a division factor D=1 for the divider 60 in the loop and comparing the phase noise performances of a conventional fractional phase locked loop by division, with a fractional phase locked loop by division and multiplexing according to the invention, the signal-to-noise ratio is improved by about 19 dB on a band of +/−25 MHz. This comparison was made using the same specifications for the two loops, particularly the same reference frequency Fref, the same cutoff frequency Fc, the same type of sigma-delta modulator, the same input divider R, the same output divider with P, and the same division factor S. Another assumption used is that synthesis is possible with a frequency Fout=2.5 GHz, using the same frequency resolution for the two loops.

For a division factor D=2 in the loop, the signal-to-noise ratio is improved by about 24 dB on a +/−25 MHz band.

If it is required to achieve similar performances for D=1 with a conventional fractional PLL by division, then the size of the filter would have to be multiplied by 64. This choice would then require a filter external to the circuit. For D=2, and with conventional fractional PLL by division, the size of the filter would have to be multiplied by 256.

Finally, according to one particular embodiment of this invention, operation of the fractional PLL by division and multiplexing according to the invention described in FIGS. 3 and 4, can be transformed to a standard programmable PLL. This is done by inhibiting or deleting the sub-assembly 46 of the modulator making the fractional part PE/$2^n$. We then only keep the adjustment parameters used for coding the integer part of the global modulation ratio β, namely N, MD and MDC. The division factor D is assumed to be equal to 1 in this embodiment.

According to this particular embodiment, the main characteristics described below are obtained:

The global modulation ratio including an integer part only:

$$\beta = \frac{NxMD + MDC}{nt}$$

The minimum frequency step at the output from the oscillator:

$$\Delta_{Fvco} = \frac{S \times Fref}{R \times nt}$$

The frequency synthesizer according to this particular embodiment with the characteristics defined above will only operate correctly if the following inequality is respected:

$MD+MDC \leq nt$

Therefore the frequency synthesizer according to this invention can be used to make a programmable fractional phase locked loop by division or a standard programmable phase locked loop, with phase noise performance characteristics and surface area and therefore cost performances significantly better than architectures according to prior art for this type of PLL.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A frequency synthesizer comprising a phase locked loop having a phase comparator for which a first input is connected to a reference signal source, a voltage controlled oscillator associated with modulation means with a global modulation ratio which when multiplied by the reference signal frequency produces the required output frequency, the modulation means comprising a frequency divider circuit to divide the frequency of the oscillator output signal by a variable integer division factor N, and the output of which is connected to the other input of the phase comparator,
   wherein the synthesizer further comprises phase generation means connected between the oscillator and the modulation means, to generate a predetermined number of phases synchronized on the frequency of the oscillator and at intervals from each other equal to a time difference representative of the phase error measured by the phase comparator,
   wherein the modulation means comprises generation means capable of generating an intermediate signal from the phases, the period of which is dependent on the said time difference between the phases and a first adjustment parameter supplied to the generation means by the control means of the generation means, the intermediate signal being applied to the divider by N circuit,
   and correction means that can determine the phase error accumulated during N−1 periods of the intermediate signal and make a correction of the intermediate signal every N periods of the intermediate signal as a function of the accumulated phase error, the correction means comprising a sigma-delta modulator such that the loop operates in fractional mode,
   wherein the output from the intermediate signal generation means is looped back to control means of the generation means, such that the control means are clocked at the frequency of the generated intermediate signal.

2. The frequency synthesizer according to claim 1, wherein the intermediate signal generation means comprise a multiplexer circuit.

3. The frequency synthesizer according to claim 1, further comprising a frequency divider circuit introducing a division factor D inserted between the output from the modulation means and the other input of the phase comparator.

4. The frequency synthesizer according to claim 1, wherein the phase generation means comprise a frequency divider circuit introducing a certain division factor into the loop.

5. The frequency synthesizer according to claim 1, wherein a frequency divider circuit is connected to the first input of the phase comparator, so as to lower the frequency of the reference signal by a certain factor.

6. The frequency synthesizer according to claim 1, wherein a frequency divider circuit is connected to the output of the oscillator such that the required output frequency from the synthesizer is determined by dividing the oscillator output frequency by a certain factor.

7. The frequency synthesizer according to claim 1, wherein the synthesizer is made in the form of an integrated circuit.

8. A frequency synthesizer, comprising a phase locked loop having a phase comparator for which a first input is connected to a reference signal source, a voltage controlled oscillator associated with modulation means with a global modulation ratio which when multiplied by the reference signal frequency produces the required output frequency, the modulation means comprising a frequency divider circuit to divide the frequency of the oscillator output signal by a variable integer division factor N, and the output of which is connected to the other input of the phase comparator,
   wherein the synthesizer further comprises phase generation means connected between the oscillator and the modulation means, to generate a predetermined number of phases synchronized on the frequency of the oscillator and at intervals from each other equal to a time difference representative of the phase error measured by the phase comparator,
   wherein the modulation means comprises generation means capable of generating an intermediate signal from the phases, the period of which is dependent on the said time difference between the phases and a first adjustment parameter supplied to the generation means by the control means of the generation means, the intermediate signal being applied to the divider by N circuit,
   and correction means that can determine the phase error accumulated during N−1 periods of the intermediate signal and make a correction of the intermediate signal every N periods of the intermediate signal as a function of the accumulated phase error, the correction means comprising a sigma-delta modulator such that the loop operates in fractional mode,
   wherein the control means of the intermediate signal generation means comprise an adder circuit for which a first input receives the first adjustment parameter MD and a second input is connected to the correction means, the output from the adder circuit being connected to a decoder circuit to control the generation means based on information output by the said adder circuit.

9. The frequency synthesizer according to claim 8, wherein the output from the correction means is connected to the second input to the adder circuit of the control means through selection means, the selection means being clocked by the output signal from the divider by N circuit, such that the output from the said correction means are selected and supplied to the said adder circuit once every N periods of the intermediate signal during one period of the said intermediate signal.

10. The frequency synthesizer according to claim 9, wherein the sigma-delta modulator of the correction means is designed to be clocked by the output signal from the divider by N circuit, the said modulator comprising an input to contain a second adjustment parameter PE coded on n bits and defining a variable fractional part of the modulation ratio, the output from the said sigma-delta modulator being connected to a first input of an adder circuit receiving a third adjustment parameter MDC on a second input, the output from said adder circuit being connected to the selection means.

11. The frequency synthesizer according to claim 10, characterized in that the sigma-delta modulator is an order 2 modulator, and the first and third adjustment parameters MD and MDC respectively are determined such that:

MD+MDC≦nt−2, where nt is the number of phases generated by the phase generation means.

12. The frequency synthesizer according to claim 10, wherein the global modulation ratio is such that:

$$\beta = \frac{NxMD + MDC + \frac{PE}{2^n}}{nt};$$

where nt is the number of phases generated by the phase generation means.

13. The frequency synthesizer according to claim 10, wherein the sigma-delta modulator is one of inhibited or deleted.

14. The frequency synthesizer according to claim 13, wherein the first and third adjustment parameters MD and MDC respectively are determined such that:

MD+MDC≦nt, where nt is the number of phases generated by the phase generation means.

15. The frequency synthesizer according to claim 14, wherein the global modulation ratio is such that:

$$\beta = \frac{NxMD + MDC}{nt}$$

where nt is the number of phases generated by the phase generation means.

16. A feedback circuit for a phase lock loop (PLL) which includes a voltage controlled oscillator generating an output frequency signal and a comparator which receives an input frequency signal and a feedback frequency signal, comprising:
a modulation circuit that receives the output frequency signal and generates the feedback frequency signal, comprising:
a multiplexer receiving a plurality of phases of the output frequency signal;
a control circuit operable to select one of the plurality of phases of the output frequency signal as an intermediate signal; and
an integer divider circuit that divides the intermediate signal to generate the feedback frequency signal wherein the control circuit comprises a decoder clocked by the intermediate signal and operable to generate a phase select signal for application to the multiplexer.

17. The circuit of claim 16 further comprising a pre-divider circuit which pre-divides the output frequency signal prior to application to the modulation circuit.

18. The circuit of claim 16 further comprising a post-divider circuit which post-divides the feedback frequency signal generated by the modulation circuit prior to application to the comparator.

19. The circuit of claim 16 wherein the plurality of phases of the output frequency signal are synchronized on the output frequency signal and have an time offset representative of a phase error measured by the comparator.

20. The circuit of claim 16 wherein the circuit is implemented as an integrated circuit.

21. A feedback circuit for a phase lock loop (PLL) which includes a voltage controlled oscillator generating an output frequency signal and a comparator which receives an input frequency signal and a feedback frequency signal, comprising:
a modulation circuit that receives the output frequency signal and generates the feedback frequency signal, comprising:
a multiplexer receiving a plurality of phases of the output frequency signal;
a control circuit operable to select one of the plurality of phases of the output frequency signal as an intermediate signal; and
an integer divider circuit that divides the intermediate signal to generate the feedback frequency signal,
wherein the control circuit comprises:
a decoder generating a phase select output that controls multiplexer selection of the selected one of the plurality of phases of the output frequency signal as the intermediate signal; and
a sigma-delta modulator clocked by the feedback frequency signal and generating a signal indicative of multiplexer selection for application to the decoder.

22. The circuit of claim 21 wherein the sigma-delta modulator includes a control input receiving an adjustment parameter defining an adjustable fractional part of a division operation performed by the modulation circuit on the received output frequency signal.

23. The circuit of claim 21 wherein the adjustment parameter for the sigma-delta modulator is coded on n bits so as to define a modulation ratio equal to the adjustment parameter divided by 2n.

24. The circuit of claim 23 wherein a global modulation ratio for the modulation circuit has the modulation ratio in the numerator and the number of phases of the output frequency signal in the denominator.

25. The circuit of claim 21 wherein the control circuit further comprises a first adder for adding a first adjustment parameter to the sigma-delta modulator generated signal.

26. The circuit of claim 25 wherein a global modulation ratio for the modulation circuit has the first adjustment parameter in the numerator and the number of phases of the output frequency signal in the denominator.

27. The circuit of claim 21 wherein the control circuit further comprises a selection circuit clocked by the feedback frequency signal to selectively output the generated signal indicative of multiplexer selection for application to the decoder.

28. The circuit of claim 21 wherein the control circuit further comprises a second adder for adding a second adjustment parameter to the generated signal indicative of multiplexer selection before application to the decoder.

29. The circuit of claim 28 wherein a global modulation ratio for the modulation circuit has the second adjustment parameter in the numerator and the number of phases of the output frequency signal in the denominator.

30. The circuit of claim 29 wherein the selected one of the plurality of phases of the output frequency signal comprising the intermediate signal has a period which is dependent on a time difference between the phases and the second adjustment parameter.

31. A feedback circuit for a phase lock loop (PLL) which includes a voltage controlled oscillator generating an output frequency signal and a comparator which receives an input frequency signal and a feedback frequency signal, comprising:

a modulation circuit that receives the output frequency signal and generates the feedback frequency signal, comprising:

a multiplexer receiving a plurality of phases of the ouput frequency signal;

a control circuit operable to select one of the plurality of phases of the output frequency signal as an intermediate signal; and an integer divider circuit that divides the intermediate signal to generate the feedback frequency signal, wherein a global modulation ratio for the modulation circuit has a division value for the integer divider in the numerator and the number of phases of the output frequency signal in the denominator.

* * * * *

UNITED STATES PATENT AND TRADEMARK OFFICE
CERTIFICATE OF CORRECTION

| | |
|---|---|
| PATENT NO. | : 7,298,218 B2 |
| APPLICATION NO. | : 11/196492 |
| DATED | : November 20, 2007 |
| INVENTOR(S) | : Mostafa Ghazali et al. |

It is certified that error appears in the above-identified patent and that said Letters Patent is hereby corrected as shown below:

In the Claims:

At column 16, claim number 31, line number 4, please replace the word [ouput] with the word -- output --.

Signed and Sealed this
Thirteenth Day of September, 2011

David J. Kappos
*Director of the United States Patent and Trademark Office*